(12) United States Patent
Chen

(10) Patent No.: US 11,917,889 B2
(45) Date of Patent: Feb. 27, 2024

(54) FLEXIBLE DISPLAY PANEL WITH HOLLOW STRUCTURE

(71) Applicant: Wuhan China Star Optoelectronics Semiconductor Display Technology Co., Ltd., Wuhan (CN)

(72) Inventor: E Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/053,764

(22) PCT Filed: Sep. 15, 2020

(86) PCT No.: PCT/CN2020/115254
§ 371 (c)(1),
(2) Date: Nov. 7, 2020

(87) PCT Pub. No.: WO2022/041337
PCT Pub. Date: Mar. 3, 2022

(65) Prior Publication Data
US 2023/0189619 A1 Jun. 15, 2023

(30) Foreign Application Priority Data
Aug. 31, 2020 (CN) ......................... 202010895011.6

(51) Int. Cl.
*H10K 59/80* (2023.01)
*H10K 77/10* (2023.01)
(Continued)

(52) U.S. Cl.
CPC ......... *H10K 59/873* (2023.02); *H10K 77/111* (2023.02); *H10K 2102/311* (2023.02)

(58) Field of Classification Search
CPC ............... H10K 59/873; H10K 77/111; H10K 2102/311; H10K 59/122; H10K 59/12;
(Continued)

(56) References Cited

U.S. PATENT DOCUMENTS

2017/0069701 A1* 3/2017 Cai ..................... H10K 71/00
2017/0117502 A1* 4/2017 Park ................... H10K 59/124
(Continued)

FOREIGN PATENT DOCUMENTS

| CN | 107017277 A | 8/2017 |
|----|-------------|--------|
| CN | 109545831 A | 3/2019 |

(Continued)

*Primary Examiner* — Sonya McCall-Shepard
(74) *Attorney, Agent, or Firm* — Nathan & Associates; Menachem Nathan

(57) ABSTRACT

A flexible display panel is provided, which includes a base substrate, a thin film transistor (TFT) array layer, and an encapsulation layer. The TFT array layer includes an inorganic layer. An organic layer is disposed on the TFT array layer in a non-display region. The organic layer is defined with a hollow structure at least penetrating the organic layer and the encapsulation layer covers the hollow structure. The organic layer includes a planarization layer, a pixel definition layer, and a support layer. The hollow structure includes grooves with different groove levels, which improves a bending resistance of the flexible display panel and prevents cracks from extending to a display region.

16 Claims, 1 Drawing Sheet

(51) Int. Cl.
*H10K 102/00* (2023.01)
*H01L 27/12* (2006.01)
*H01L 23/00* (2006.01)
*H10K 59/122* (2023.01)
*H10K 59/12* (2023.01)

(58) Field of Classification Search
CPC .... H10K 59/10; H10K 59/8731; H10K 77/00; H10K 77/10; H10K 50/844; H10K 50/8445; H10K 59/8732; H10K 59/1201; H10K 59/121; H10K 59/1213; H10K 59/124; H10K 59/125; H01L 23/562; H01L 27/1218

See application file for complete search history.

(56) References Cited

U.S. PATENT DOCUMENTS

| | | | | |
|---|---|---|---|---|
| 2017/0194404 | A1* | 7/2017 | Park | H10K 59/124 |
| 2017/0331058 | A1 | 11/2017 | Seo et al. | |
| 2019/0044092 | A1* | 2/2019 | Park | H10K 50/844 |
| 2020/0105168 | A1* | 4/2020 | Choi | G06F 1/1652 |

FOREIGN PATENT DOCUMENTS

| | | |
|---|---|---|
| CN | 110112306 A | 8/2019 |
| CN | 110504386 A | 11/2019 |
| CN | 210224038 U | 3/2020 |
| CN | 111092102 A | 5/2020 |
| CN | 111106145 A | 5/2020 |
| CN | 111129347 A | 5/2020 |
| CN | 111416063 A | 7/2020 |
| CN | 111430566 A | 7/2020 |

\* cited by examiner

FLEXIBLE DISPLAY PANEL WITH HOLLOW STRUCTURE

FIELD OF INVENTION

The present invention relates to the field of display technologies, and in particular to a flexible display panel.

BACKGROUND OF INVENTION

In recent years, active-matrix organic light-emitting diode (AMOLED) displays have received extensive attention and applications due to their advantages of high contrast ratio, wide viewing angles, and flexibility. In particular, their bending characteristics have attracted attention of consumers, and as the technology becomes more mature, bendable displays are gradually appearing in various settings.

For a bendable display screen, it is extremely important to ensure that there is no breakage or peeling after bending. However, for the bendable display screen in the conventional art, an inorganic encapsulation layer of an encapsulation layer positioned in a non-display region is mainly in direct contact with an anode and an inorganic layer. Since the inorganic encapsulation layer has a greater Young's modulus compared with the organic layer, it is brittle and hard, so when the bendable display screen is being bent, it is easier to cause breakage which leads to product malfunction.

Therefore, it is necessary to provide a new flexible display panel to solve the above technical problems.

SUMMARY OF INVENTION

Technical Problem

A flexible display panel provided by the present invention solves technical problems of a current flexible display panel that an inorganic encapsulation layer is mainly in direct contact with an anode and an inorganic layer, which causes the flexible display panel to be easily broken when it is being bent.

Technical Solutions

To solve the above problems, a technical solution provided by the present invention is as follows.

An embodiment of the present invention provides a flexible display panel including a display region and a non-display region arranged around the display region;
wherein the flexible display panel includes a base substrate, a thin film transistor (TFT) array layer disposed on the base substrate, and an encapsulation layer disposed on the TFT array layer; and wherein the TFT array layer includes an inorganic layer, an organic layer disposed on the TFT array layer and positioned in the non-display region, the organic layer is provided with a hollow structure at least penetrating the organic layer, the encapsulation layer covers the hollow structure, and the encapsulation layer is a multilayered structure consisting of a first inorganic encapsulation layer, an organic encapsulation layer, and a second inorganic encapsulation layer stacked in sequence.

The flexible display panel according to an embodiment of the present invention, the organic layer includes one or more of a planarization layer, a pixel definition layer, and a support layer sequentially disposed on the TFT array layer, the planarization layer and the pixel definition layer extend from the display region to the non-display region, and the hollow structure further penetrates the support layer.

The flexible display panel according to an embodiment of the present invention, the non-display region includes two opposite sides, and the hollow structure is arranged parallel to the two sides.

The flexible display panel according to an embodiment of the present invention, the hollow structure includes at least one first groove and at least one second groove;
the first groove is defined at an edge of the non-display region close to the display region, the first groove penetrates the support layer, the pixel definition layer, and the planarization layer; the second groove is defined at the edge of the non-display region away from the display region, and the second groove penetrates the support layer, the pixel definition layer, the planarization layer, and the inorganic layer.

The flexible display panel according to an embodiment of the present invention, shapes of the first groove and the second groove are elongated, and lengths of orthographic projections of the first groove and the second groove on the base substrate are equal to lengths of the two sides.

The flexible display panel according to an embodiment of the present invention, the hollow structure further includes a plurality of third grooves and fourth grooves arranged at intervals, and the third grooves and the fourth grooves penetrate at least the support layer.

The flexible display panel according to an embodiment of the present invention, the third grooves and the fourth grooves are distributed in a plurality of rows at intervals, and each of the rows includes at least one of the third grooves or the fourth grooves, and the third grooves and the fourth grooves positioned in any adjacent two of the rows are staggered.

The flexible display panel according to an embodiment of the present invention, shapes of the third grooves and the fourth grooves include rectangular or elliptical.

The flexible display panel according to an embodiment of the present invention, a length of an orthographic projection of the planarization layer on the base substrate is less than a length of an orthographic projection of the pixel definition layer on the base substrate.

The flexible display panel according to an embodiment of the present invention, the inorganic layer includes any one or more of a buffer layer, a first gate insulating layer, a second gate insulating layer, and an interlayer dielectric layer.

The present invention further provides a flexible display panel, including a display region and a non-display region arranged around the display region;
wherein the flexible display panel includes a base substrate, a thin film transistor (TFT) array layer disposed on the base substrate, and an encapsulation layer disposed on the TFT array layer; and wherein the TFT array layer includes an inorganic layer, an organic layer disposed on the TFT array layer and positioned in the non-display region, the organic layer is provided with a hollow structure at least penetrating the organic layer, and the encapsulation layer covers the hollow structure.

The flexible display panel according to an embodiment of the present invention, the organic layer includes one or more of a planarization layer, a pixel definition layer, and a support layer sequentially disposed on the TFT array layer, the planarization layer and the pixel definition layer extend from the display region to the non-display region, and the hollow structure further penetrates the support layer.

The flexible display panel according to an embodiment of the present invention, the non-display region includes two opposite sides, and the hollow structure is arranged parallel to the two sides.

The flexible display panel according to an embodiment of the present invention, the hollow structure includes at least one first groove and at least one second groove;

the first groove is defined at an edge of the non-display region close to the display region, the first groove penetrates the support layer, the pixel definition layer, and the planarization layer; the second groove is defined at the edge of the non-display region away from the display region, and the second groove penetrates the support layer, the pixel definition layer, the planarization layer, and the inorganic layer.

The flexible display panel according to an embodiment of the present invention, shapes of the first groove and the second groove are elongated, and lengths of orthographic projections of the first groove and the second groove on the base substrate are equal to lengths of the two sides.

The flexible display panel according to an embodiment of the present invention, the hollow structure further includes a plurality of third grooves and fourth grooves arranged at intervals, and the third grooves and the fourth grooves penetrate at least the support layer.

The flexible display panel according to an embodiment of the present invention, the third grooves and the fourth grooves are distributed in a plurality of rows at intervals, and each of the rows includes at least one of the third grooves or the fourth grooves, and the third grooves and the fourth grooves positioned in any adjacent two of the rows are staggered.

The flexible display panel according to an embodiment of the present invention, shapes of the third grooves and the fourth grooves include rectangular or elliptical.

The flexible display panel according to an embodiment of the present invention, a length of an orthographic projection of the planarization layer on the base substrate is less than a length of an orthographic projection of the pixel definition layer on the base substrate.

The flexible display panel according to an embodiment of the present invention, the inorganic layer includes any one or more of a buffer layer, a first gate insulating layer, a second gate insulating layer, and an interlayer dielectric layer.

Beneficial Effect

The beneficial effects of the present invention are as follows. The flexible display panel provided by the present invention, wherein the planarization layer, the pixel definition layer, and the support layer extend from the display region to the non-display region, the inorganic layer, the planarization layer, the pixel definition layer, and the support layer positioned in the non-display region are defined with the hollow structure at least penetrating the support layer, and the hollow structure includes grooves with different groove levels, can improve a bending resistance of the flexible display panel and reduce risk of cracks. In addition, it can effectively prevent cracks from extending to the display region and affecting display effect.

BRIEF DESCRIPTION OF FIGURES

In order to illustrate the technical solutions of the present application or the related art in a clearer manner, the drawings desired for the present application or the related art will be described hereinafter briefly. Obviously, the following drawings merely relate to some embodiments of the present application, and based on these drawings, a person skilled in the art may obtain the other drawings without any creative effort.

DETAILED DESCRIPTION OF EMBODIMENTS

Figure 1:
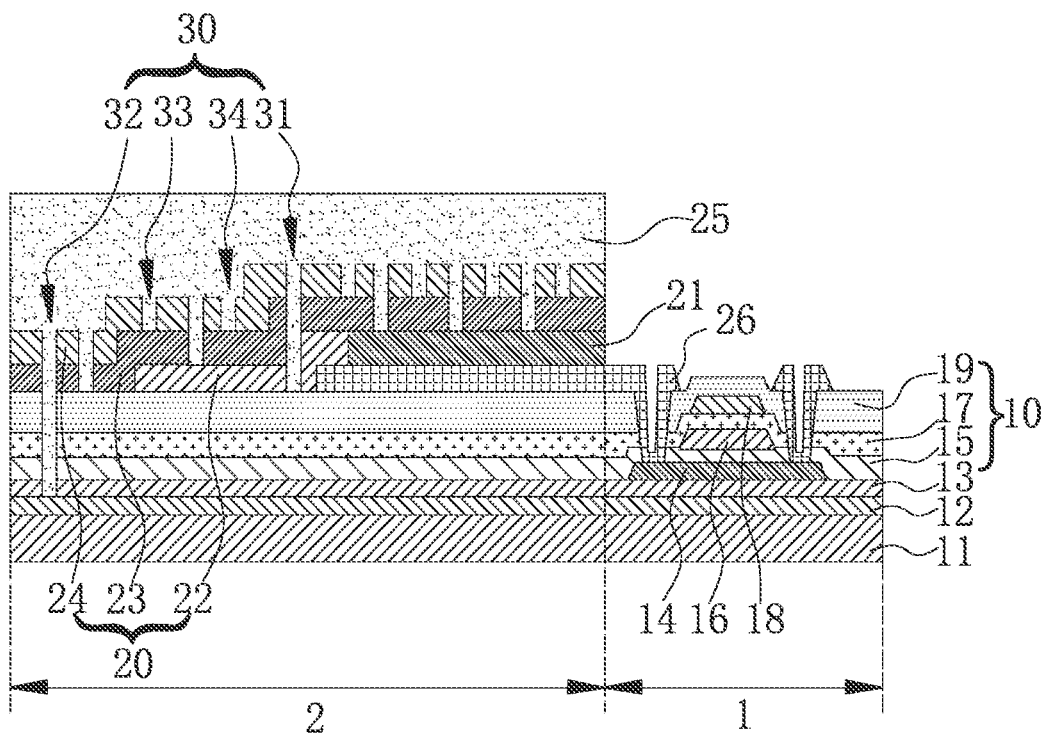
FIG. 1 is a schematic cross-sectional structural diagram of a flexible display panel provided by an embodiment of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present invention is directed to a flexible display panel in a conventional art. Since an inorganic encapsulation layer is mainly in direct contact with an anode and an inorganic layer, the flexible display panel is more likely to break when it is being bent. The present embodiment can solve this defect.

As shown in FIG. 1, a flexible display panel provided by an embodiment of the present invention includes a display region 1 and a non-display region 2 arranged around the display region 1. The display region 1 is configured to display images, and the non-display region 2 is a frame of the flexible display panel.

The flexible display panel includes a base substrate 11 and an inorganic layer 10 disposed on the base substrate 11. A thin film transistor (TFT) array layer is disposed on the inorganic layer 10 in the display region 1, and the TFT array layer can be a dual-gate structure. Specifically, the TFT array layer includes a buffer layer 13, an active layer 14, a first gate insulation layer 15, a first gate 16, a second gate insulation layer 17, a second gate 18, an interlayer dielectric layer 19, a source-drain metal layer 26, an anode 21, a planarization layer 22, and a pixel definition layer 23 which are sequentially disposed on the base substrate 11. Wherein, the inorganic layer 10 can include any one or more of the buffer layer 13, the first gate insulation layer 15, the second gate insulation layer 17, and the interlayer dielectric layer 19.

The flexible display panel further includes a light-emitting layer (not shown in the figure) and an encapsulation layer 25. The light-emitting layer is disposed on the TFT array layer in the display region 1, and the encapsulation layer 25 covers the light-emitting layer and an organic layer 20. Specifically, the encapsulation layer 25 can be a multilayered structure in which a first inorganic encapsulation layer, an organic encapsulation layer, and a second inorganic encapsulation layer are stacked in sequence, wherein a boundary between the first inorganic encapsulation layer and the second inorganic encapsulation layer is positioned at an edge of the non-display region 2 away from the display region 1, and a boundary of the organic encapsulation layer is close to the anode 21 and the source-drain metal layer 26.

The organic layer 20 is positioned on the TFT array layer of the non-display region 2, the organic layer 20 is defined with a hollow structure 30 at least penetrating the organic layer 20, and the encapsulation layer 25 covers the hollow structure 30. Since the organic layer 20 can be in direct contact with the anode 21, the organic layer 20 has a lower hardness compared to that of an inorganic material in the encapsulation layer 25, therefore, a bending resistance of the flexible display panel can be improved, and cracks can be prevented. Moreover, due to an arrangement of the hollow structure 30, crack extension can be effectively prevented.

It should be noted that the organic layer 20 can be separately disposed in the non-display region 2 or can be extended from the display region 1 to the non-display region 2 by other organic film layers on the flexible display panel, to save process steps.

In the embodiment of the present invention, the organic layer 20 includes the planarization layer 22, the pixel definition layer 23, and the support layer 24 positioned on the pixel definition layer 23 that are sequentially disposed on the TFT array layer. Wherein, the planarization layer 22 and the pixel definition layer 23 can extend from the display region 1 to the non-display region 2. Specifically, the planarization layer 22, the pixel definition layer 23, and the support layer 24 are disposed on the inorganic layer 10. Because the planarization layer 22, the pixel definition layer 23, and the support layer 24 are generally made of organic materials, they have a lower Young's modulus and therefore have good bending resistance, which can effectively improve the bending resistance of the flexible display panel.

Furthermore, a length of an orthographic projection of the planarization layer 22 on the base substrate 11 is less than a length of an orthographic projection of the pixel definition layer 23 on the base substrate 11. A purpose of this arrangement is so that the pixel definition layer 23 being directly in contact with the inorganic layer 10 has a better ability to block water vapor compared with the planarization layer 22 being directly in contact with the inorganic layer 10. Therefore, in the embodiment of the present invention, the pixel definition layer 23 is protruded a part of the length compared to the planarization layer 22 for contacting the interlayer dielectric layer 19 in the inorganic layer 10.

Figure 2:
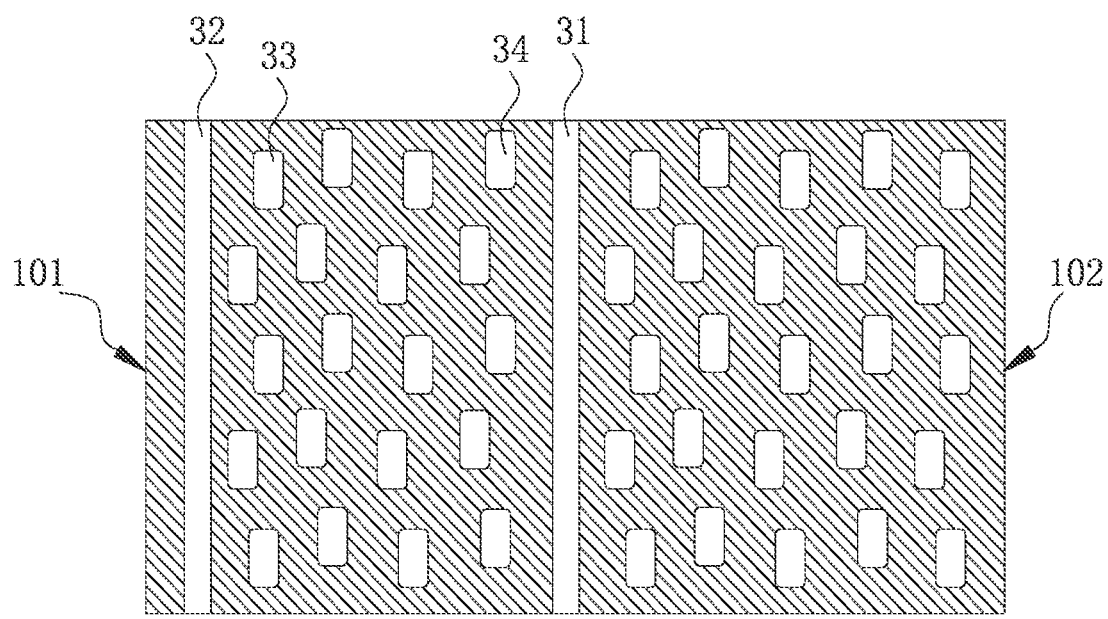
FIG. 2 is a schematic top view of a non-display region of the flexible display panel provided by the embodiment of the present invention.

With reference to FIG. 2, the embodiment of the present invention takes the display region 1 and the non-display region 2 of the flexible display panel as rectangular as an example for explanation. Specifically, the non-display region of the flexible display panel 2 includes two opposite sides, the two sides include a first side 101 and a second side 102, the first side 101 and the second side 102 are arranged in parallel, and the hollow structure 30 is defined parallel to both the first side 101 and the second side 102.

Specifically, the hollow structure 30 includes at least one first groove 31 and at least one second groove 32, wherein the first groove 31 is defined on an edge of the non-display region 2 close to the display region 1. Wherein, the organic encapsulation layer is filled in the first groove 31. In the embodiment of the present invention, the first groove 31 penetrates the support layer 24, the pixel definition layer 23, and the planarization layer 22, to ensure that the organic encapsulation layer in the encapsulation layer 25 will not overflow outside the second inorganic encapsulation layer, acting like a dam. The second groove 32 is defined in the edge of the non-display region 2 away from the display region 1, that is, the second groove 32 is positioned in the non-display region 2 close to a cutting line. In the embodiment of the present invention, the second groove 32 penetrates the support layer 24, the pixel definition layer 23, the planarization layer 22, and the inorganic layer 10. As the cracks generated when the flexible display panel is cut or bent during a production process are usually easier to expand and extend along the inorganic layer 10, when the cracks extend to the second groove 32, since the inorganic layer 10 is interrupted here, it can effectively prevent the cracks from extending to the display region 1 and influencing display effect.

In the embodiment of the present invention, a shape of the first groove 31 and the second groove 32 can be elongated, and lengths of orthographic projections of the first groove 31 and the second groove 32 on the base substrate 11 are equal to lengths of the two sides, which can effectively prevent the cracks from extending.

It should be noted that, since there is no filling of the organic encapsulation layer in an interval between the first groove 31 and the second groove 32, a depth of the first groove 31 and the second groove 32 should not be too deep to ensure that a first inorganic encapsulation layer and a second inorganic encapsulation layer will not be broken in a slope. In the meanwhile, since the first groove 31 and the second groove 32 have higher requirements on a gradeability of the first inorganic encapsulation layer and the second inorganic encapsulation layer, numbers of the first groove 31 and the second groove 32 should not be excessive and are typically set at two to three.

Specifically, the hollow structure 30 further includes a plurality of third grooves 33 and fourth grooves 34 arranged at intervals, and the third grooves 33 and the fourth grooves 34 at least penetrate the support layer 24 to improve a bending performance of the flexible display panel. In the embodiment of the present invention, the third grooves 33 penetrate the support layer 24 and the pixel definition layer 23, and the fourth grooves 34 penetrate the support layer 24.

The third grooves 33 and the fourth grooves 34 are distributed in multiple rows at intervals, and each of the rows has at least one of the third grooves 33 or the fourth grooves 34, and the third grooves and the fourth grooves positioned in any adjacent two of the rows are staggered. In addition, a shape of the third grooves 33 and the fourth grooves 34 include rectangular or elliptical or any other shapes. The embodiment of the present invention is not limited thereto.

Secondly, the embodiment of the present invention does not specifically limit a density of the third grooves 33 and the fourth grooves 34, and they can be set according to a size of the non-display region 2 and actual conditions.

The flexible display panel further includes a water and oxygen barrier layer 12, the water and oxygen barrier layer 12 is disposed between the base substrate 11 and the inorganic layer 10 to prevent the TFT array layer from water and oxygen corrosion.

The embodiment of the present invention also provides a manufacturing method of the flexible display panel, including following steps.

S10, providing the base substrate 11, and depositing the water and oxygen barrier layer 12, the buffer layer 13, and an amorphous silicon layer on the base substrate 11 in sequence.

Material of the buffer layer 13 can be SiOx, SiNx, etc.

S20, processing the amorphous silicon layer by a photolithography process to form the active layer 14.

S30, depositing the first gate insulation layer 15 and a first metal layer on the active layer 14 in sequence, and processing the first metal layer by a photolithography process to form the first gate 16.

S40, depositing the second gate insulation layer 17 and a second metal layer on the first gate 16 and the first gate insulation layer 15 in sequence, and processing the second metal layer by a photolithography process to form the second gate 18.

S50, depositing the interlayer dielectric layer 19 and the source-drain metal layer 26 on the second gate 18 and the second gate insulation layer 17, and processing the source-drain metal layer 26 by a photolithography process to form sources and drains.

Material of the source-drain metal layer 26 can be a Ti/Al/Ti metal film layer.

S60, coating the planarization layer 22, an anode metal layer, the pixel definition layer 23, and the support layer 24 on an entire surface of the sources and the drains in sequence, and processing the planarization layer 22, the anode metal layer, the pixel definition layer 23, and the support layer 24 by a photolithography process, respectively, to form the anode 21 and the hollow structure 30.

Specifically, patterning the pixel definition layer 23 in the display region 1 to form an opening, and the opening is filled with the light-emitting layer. The hollow structure 30 includes the first groove 31, the second groove 32, the third grooves 33, and the fourth grooves 34, it should be noted that for the positions and specific structures of several types of grooves, reference can be made to the above description, which will not be repeated here.

S70, depositing the encapsulation layer 25 on the formed TFT array layer, and the encapsulation layer 25 is filled in the hollow structure 30.

Specifically, the first inorganic encapsulation layer, the organic encapsulation layer, and the second inorganic encapsulation layer are sequentially formed on the TFT array layer, wherein the first inorganic encapsulation layer and the second inorganic encapsulation layer can be deposited by physical vapor deposition. The organic encapsulation layer can be made by inkjet printing and ultraviolet (UV) curing. Materials of the first inorganic encapsulation layer and the second inorganic encapsulation layer can be SiOx, SiNx, SiONx, etc. Material of the organic encapsulation layer can be acrylic or epoxy-based material.

In the embodiment of the present invention, the planarization 22, the pixel definition layer 23, and the support layer 24 positioned in the non-display region 2 and the display region 1 can be performed in a same manufacturing process, which can save cost and improve efficiency.

The beneficial effect is as follows. The flexible display panel provided by the present invention, wherein the planarization layer, the pixel definition layer, and the support layer extend from the display region to the non-display region, the inorganic layer, the planarization layer, the pixel definition layer, and the support layer positioned in the non-display region are defined with the hollow structure at least penetrating the support layer, and the hollow structure includes grooves with different groove levels, can improve a bending resistance of the flexible display panel and reduce risk of cracks. In addition, it can effectively prevent cracks from extending to the display region and affecting display effect.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A flexible display panel, comprising a display region and a non-display region arranged around the display region, wherein the flexible display panel comprises a base substrate, a thin film transistor (TFT) array layer disposed on the base substrate, and an encapsulation layer disposed on the TFT array layer; and
wherein the TFT array layer comprises an inorganic layer, an organic layer disposed on the TFT array layer and positioned in the non-display region, the organic layer is provided with a hollow structure at least penetrating the organic layer, the encapsulation layer covers the hollow structure, and the encapsulation layer is a multilayered structure consisting of a first inorganic encapsulation layer, an organic encapsulation layer, and a second inorganic encapsulation layer stacked in sequence;
wherein the organic layer comprises one or more of a planarization layer, a pixel definition layer, and a support layer sequentially disposed on the TFT array layer, the planarization layer and the pixel definition layer extend from the display region to the non-display region, and the hollow structure further penetrates the support layer; and
wherein a length of an orthographic projection of the planarization layer on the base substrate is less than a length of an orthographic projection of the pixel definition layer on the base substrate.

2. The flexible display panel of claim 1, wherein the non-display region comprises two opposite sides, and the hollow structure is arranged parallel to the two sides.

3. The flexible display panel of claim 2, wherein the hollow structure comprises at least one first groove and at least one second groove, the first groove is defined at an edge of the non-display region close to the display region, the first groove penetrates the support layer, the pixel definition layer, and the planarization layer, the second groove is defined at an edge of the non-display region away from the display region, and the second groove penetrates the support layer, the pixel definition layer, the planarization layer, and the inorganic layer.

4. The flexible display panel of claim 3, wherein shapes of the first groove and the second groove are elongated, and lengths of orthographic projections of the first groove and the second groove on the base substrate are equal to lengths of the two sides.

5. The flexible display panel of claim 2, wherein the hollow structure further comprises a plurality of third grooves and fourth grooves arranged at intervals, and the third grooves and the fourth grooves penetrate at least the support layer.

6. The flexible display panel of claim 5, wherein the third grooves and the fourth grooves are distributed in a plurality of rows at intervals, and each of the rows comprises at least one of the third grooves or the fourth grooves, and the third grooves and the fourth grooves positioned in any adjacent two of the rows are staggered.

7. The flexible display panel of claim 5, wherein shapes of the third grooves and the fourth grooves comprise rectangular or elliptical.

8. The flexible display panel of claim 1, wherein the inorganic layer comprises any one or more of a buffer layer, a first gate insulating layer, a second gate insulating layer, and an interlayer dielectric layer.

9. A flexible display panel, comprising a display region and a non-display region arranged around the display region, wherein the flexible display panel comprises a base substrate, a thin film transistor (TFT) array layer disposed on the base substrate, and an encapsulation layer disposed on the TFT array layer; and wherein the TFT array layer comprises an inorganic layer, an organic layer disposed on the TFT array layer and positioned in the non-display region, the organic layer is provided with a hollow structure at least penetrating the organic layer, and the encapsulation layer covers the hollow structure;

wherein the organic layer comprises one or more of a planarization layer, a pixel definition layer, and a support layer sequentially disposed on the TFT array layer, the planarization layer and the pixel definition layer extend from the display region to the non-display region, and the hollow structure further penetrates the support layer; and wherein a length of an orthographic projection of the planarization layer on the base substrate is less than a length of an orthographic projection of the pixel definition layer on the base substrate.

10. The flexible display panel of claim 9, wherein the non-display region comprises two opposite sides, and the hollow structure is arranged parallel to the two sides.

11. The flexible display panel of claim 10, wherein the hollow structure comprises at least one first groove and at least one second groove, the first groove is defined at an edge of the non-display region close to the display region, the first groove penetrates the support layer, the pixel definition layer, and the planarization layer, the second groove is defined at an edge of the non-display region away from the display region, and the second groove penetrates the support layer, the pixel definition layer, the planarization layer, and the inorganic layer.

12. The flexible display panel of claim 11, wherein shapes of the first groove and the second groove are elongated, and lengths of orthographic projections of the first groove and the second groove on the base substrate are equal to lengths of the two sides.

13. The flexible display panel of claim 10, wherein the hollow structure further comprises a plurality of third grooves and fourth grooves arranged at intervals, and the third grooves and the fourth grooves penetrate at least the support layer.

14. The flexible display panel of claim 13, wherein the third grooves and the fourth grooves are distributed in a plurality of rows at intervals, and each of the rows comprises at least one of the third grooves or the fourth grooves, and the third grooves and the fourth grooves positioned in any adjacent two of the rows are staggered.

15. The flexible display panel of claim 13, wherein shapes of the third grooves and the fourth grooves comprise rectangular or elliptical.

16. The flexible display panel of claim 9, wherein the inorganic layer comprises any one or more of a buffer layer, a first gate insulating layer, a second gate insulating layer, and an interlayer dielectric layer.

* * * * *